United States Patent
Ichikawa (12) 
(10) Patent No.: US 6,451,640 B1
(45) Date of Patent: Sep. 17, 2002

(54) SEMICONDUCTOR DEVICE HAVING NMOS AND PMOS TRANSISTORS ON COMMON SUBSTRATE AND METHOD OF FABRICATING THE SAME

(75) Inventor: Toshihiko Ichikawa, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/609,352

(22) Filed: Jul. 5, 2000

Related U.S. Application Data (62) Division of application No. 08/993,554, filed on Dec. 18, 1997, now abandoned.

(30) Foreign Application Priority Data

Dec. 20, 1996 (JP) .............................................. 8-340694

(51) Int. Cl.[7] .......................................... H01L 21/8238
(52) U.S. Cl. ...................... 438/199; 438/224; 438/227; 438/228; 438/232; 438/527
(58) Field of Search ................. 438/224, 549, 438/199–200, 217, 220, 225–228, 232, 527, 529

(56) References Cited

U.S. PATENT DOCUMENTS

| | | | | |
|---|---|---|---|---|
| 4,628,341 A | * | 12/1986 | Thomas | 257/338 |
| 4,918,026 A | * | 4/1990 | Kosiak et al. | 438/207 |
| 5,043,788 A | | 8/1991 | Omoto et al. | 357/42 |
| 5,047,358 A | * | 9/1991 | Kosiak et al. | 438/200 |
| 5,254,487 A | * | 10/1993 | Tamagawa | 438/217 |
| 5,468,666 A | | 11/1995 | Chapman | 257/369 |
| 5,527,722 A | * | 6/1996 | Hutter et al. | 438/231 |
| 5,578,855 A | | 11/1996 | Guffur et al. | 257/371 |
| 5,747,850 A | * | 5/1998 | Mei | 257/328 |
| 5,795,803 A | * | 8/1998 | Takamura et al. | 438/228 |
| 5,847,432 A | * | 12/1998 | Nozaki | 257/369 |

FOREIGN PATENT DOCUMENTS

| | | | |
|---|---|---|---|
| EP | 387999 | 9/1990 | |
| EP | 677876 | 10/1995 | |
| EP | 0 677 876 A1 | * 10/1995 | .......... H01L/27/092 |
| EP | 0849801 A2 | * 6/1998 | |
| JP | 56-61159 | 5/1981 | |
| JP | 61-88553 | 5/1986 | |
| JP | 62155555 | 7/1987 | |
| JP | 2-284462 | 11/1990 | |
| JP | 6295863 | 10/1994 | |
| JP | 7221196 | 8/1995 | |
| JP | 7-307394 | 11/1995 | |
| WO | 95 27310 | 10/1995 | |

\* cited by examiner

*Primary Examiner*—Eddie Lee
*Assistant Examiner*—José R Díaz
(74) *Attorney, Agent, or Firm*—Dickstein Shapiro Morin & Oshinsky LLP (57) ABSTRACT

There is provided a method of fabricating a semiconductor device, including the steps of (a) forming first well regions in a semiconductor substrate in all regions in which high-voltage and low-voltage MOS transistors are to be formed, the semiconductor At e having a first conductivity and the first well regions having a second conductivity, (b) forming an isolation layer on the semiconductor substrate for isolating the first well regions from each other, (c) forming high-voltage well regions having a first conductivity and low-voltage well regions one of which has a first conductivity and another of which has a second conductivity, and (d) forming MOS transistors on the high-voltage and low-voltage well regions. The high-voltage and low-voltage well regions are formed with the isolation layer being used as a mark. The above-mentioned method makes it possible to form low-voltage and high-voltage MOS transistors on a common semiconductor substrate in the smallest number of fabrication steps.

12 Claims, 12 Drawing Sheets

SEMICONDUCTOR DEVICE HAVING NMOS AND PMOS TRANSISTORS ON COMMON SUBSTRATE AND METHOD OF FABRICATING THE SAME

This is a divisional of application Ser. No. 08/993,554, filed Dec. 18, 1997, now abandoned.

BACKGROUND OF THE INVENTION

1. Field of the Invention

The invention relates to a semiconductor device including a low-voltage circuit, which constitutes a high-speed microcomputer and a high-speed logic circuit, for instance, and a high-voltage circuit both formed on a common semiconductor substrate, and further to a method of fabricating the same.

2. Description of the Related Art

A logic circuit for a micro-computer and so on is operated generally with a low-voltage power supply providing a voltage of 7V or smaller, and processes signals having a voltage of 7V or smaller. Accordingly, a microcomputer is requested to have a structure capable of being operated at a voltage such as 7V or smaller. On the other hand, a high-voltage circuit deals with a voltage much greater than 7V, and hence is requested to have a structure capable of being operated at a high voltage.

FIGS. 1A to 1D are cross-sectional views of low-voltage MOS transistors and high-voltage MOS transistors both used in a microcomputer. FIGS. 1A to 1D illustrate a high-voltage NMOS transistor, a high-voltage PMOS transistor, a low-voltage NMOS transistor, and a low-voltage PMOS transistor, respectively.

Figure 1A:
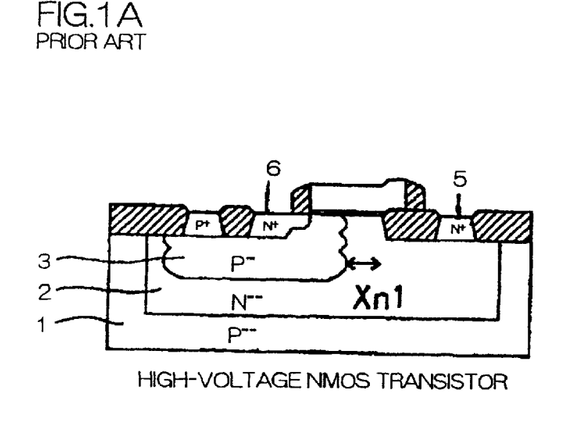
FIG. 1A is a cross-sectional view of high-voltage NMOS transistor.
Figure 1B:
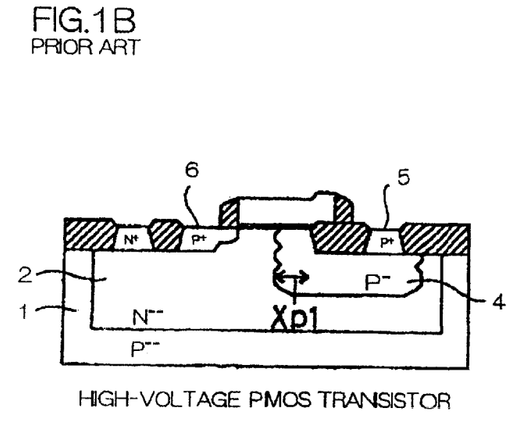
FIG. 1B is a cross-sectional view of high-voltage PMOS transistor.

As illustrated in FIGS. 1A and 1B, the high-voltage NMOS and PMOS transistors are formed with a high-voltage n--type well 2 in a p--type semiconductor substrate 1. The high-voltage NMOS transistor illustrated in FIG. 1A is further formed with a p--type channel formation region 3 in the n--type well region 2, whereas the high-voltage PMOS transistor illustrated in FIG. 1B is further formed with a p--type extended drain region 4 in the n--type well region 2. Thus, the high-voltage NMOS and PMOS transistors are characterized by that drain electrodes of them have a highly doped n- or p-type region 5 serving as a drain diffusion layer, surrounded by the regions 2 and 4 doped more lightly than 5 sources 6. The more lightly doped regions 2 and 4 than the sources 6 ensure that the high-voltage NMOS and PMOS transistors operate at a high voltage.

Figure 1C:
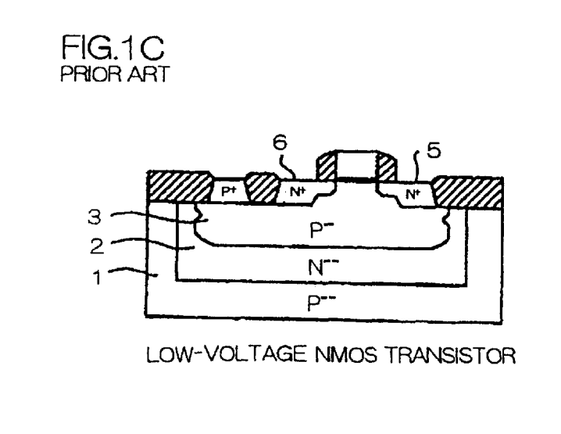
FIG. 1C is a cross-sectional view of low-voltage NMOS transistor.
Figure 1D:
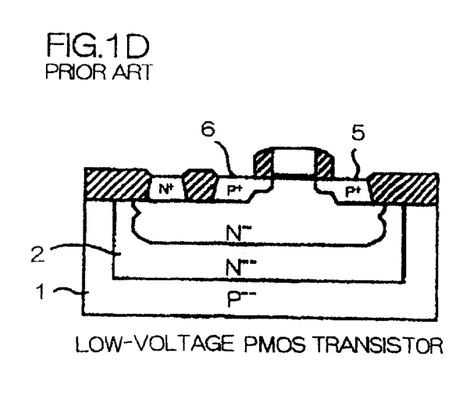
FIG. 1D is a cross-sectional view of low-voltage PMOS transistor.

On the other hand, as is obvious in view of FIGS. 1C and 1D, low-voltage NMOS and PMOS transistors are not formed with regions corresponding to the above-mentioned regions 2 and 4 more lightly doped than the sources 6.

Hence, if a semiconductor device including high-voltage and low-voltage MOS transistors is to be fabricated in order to drive a fluorescent character display tube or a liquid crystal character display tube with a micro-computer, for instance, there are two ways for fabrication such a semiconductor device.

The first one is to fabricate a low-voltage MOS transistor used for a microcomputer and a high-voltage MOS transistor as a driver on different semiconductor substrates, and use them as two LSI chips. The second one is to fabricate a single LSI chip having a semiconductor substrate on which high-voltage and low-voltage MOS transistors are formed together. Comparing those two ways, the second one where a single LSI chip is fabricated is more advantageous than the first one with respect to a size of a device and fabrication cost.

Figure 2A:
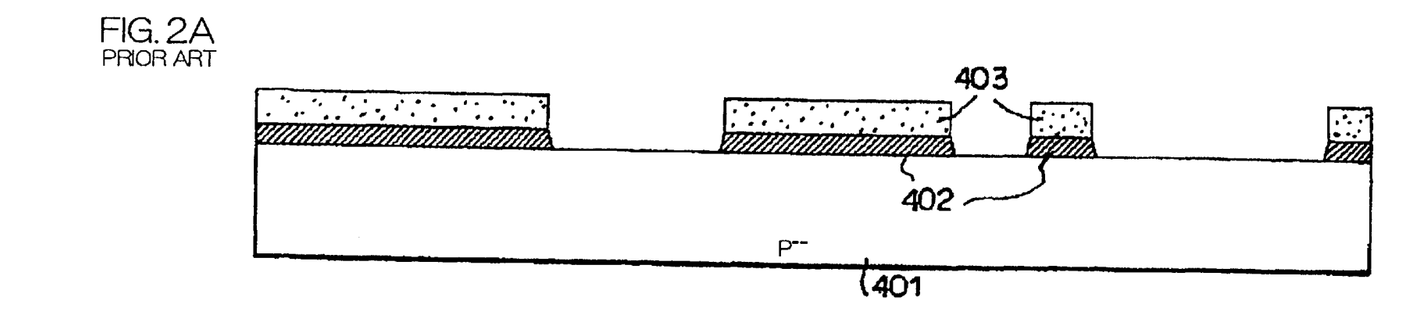
FIGS. 2A to 2L are cross-sectional views of a semiconductor device, illustrating respective steps, in order, of a conventional method of fabricating the same.

FIGS. 2A to 2L are cross-sectional views of a semiconductor device, illustrating respective steps, in order, of a conventional method of fabricating a semiconductor device including a logic circuit and a high-voltage circuit on a common semiconductor substrate. In this example explained hereinbelow, a low-voltage NMOS transistor, a low-voltage PMOS transistor, a high-voltage NMOS transistor, and a high-voltage PMOS transistor are all to be fabricated on a common p-type silicon substrate. First, there is prepared a p-type silicon substrate 401 having an impurity concentration in the range of $0.5 \times 10^{16}$ to $1 \times 10^{16}$ cm$^{-3}$. Then, as illustrated in FIG. 2A, an oxide film 402 is grown by a thickness of 480 nm on the p-type silicon substrate 401, followed by deposition a photoresist film 403 all over the oxide film 402. Then, a first photolithography and etching step is carried out to thereby partially remove the oxide film 402 in regions where high-voltage and low-voltage n-type well regions are to be formed, with the photoresist film 403 being used as an etching mask.

Figure 2B:
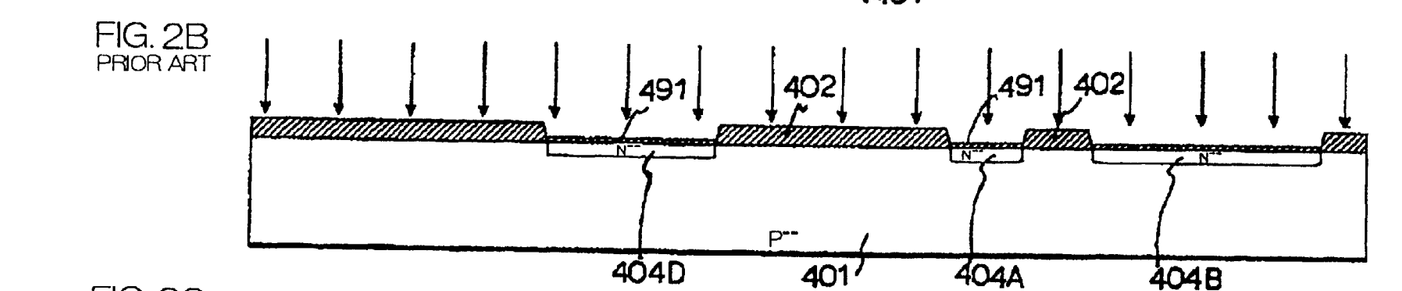

Then, as illustrated in FIG. 2B, after the photoresist film 403 has been removed, a thin oxide film 491 is grown on a surface of the p-type silicon substrate 401 in exposed regions thereof. The oxide film 491 has a thickness of about 40 nm. The oxide film 491 is grown for preventing channeling in ion-implantation and precipitation of impurities caused by thermal annealing carried out at a high temperature. Then, the p-type silicon substrate 1 is implanted at 150 KeV with doses of $1 \times 10^{13}$ cm$^{-2}$ of n-type impurity ions such as phosphorus with the oxide film 402 being used as an ion-implantation mask. Thus, there are formed ionimplanted regions 404A, 404B and 404D.

Figure 2C:
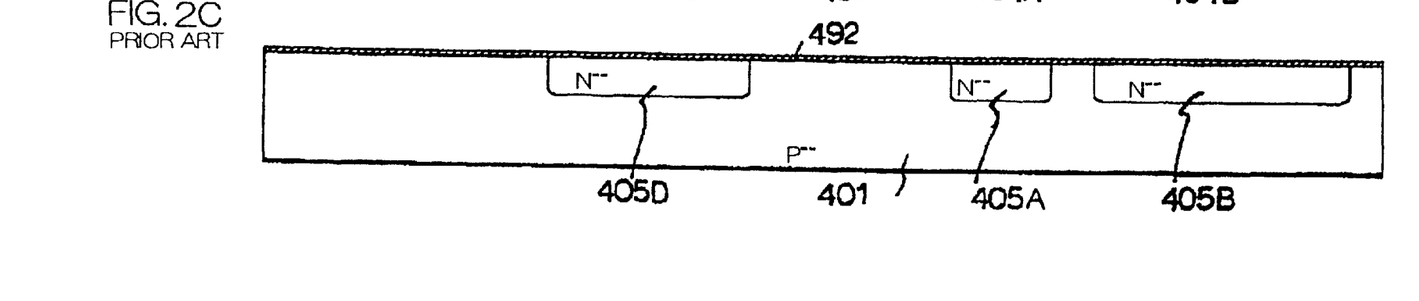

Then, a first annealing is carried out at 1200° C. for about 5 hours. As a result, the ion-implanted regions or n-type impurity regions 404A, 404B and 404D are diffused laterally and in a depth-wise direction of the p-type silicon substrate 401 to thereby make impurity regions 405A, 405B and 405D, as illustrated in FIG. 2C. The oxide film 491 is all removed, and then a thin oxide film 492 is formed again at a surface of the p-type silicon substrate 401.

Figure 2D:
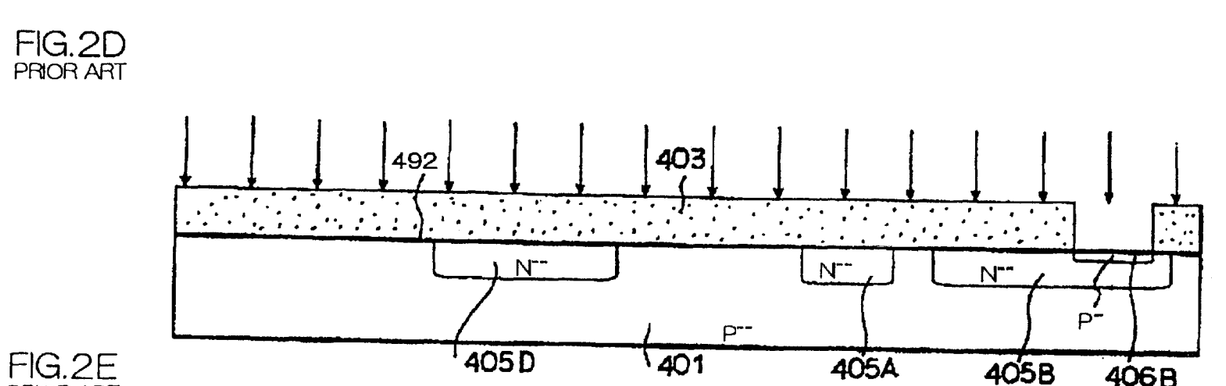

Then, a photoresist film 403 is formed again entirely over the oxide film 492. Then, a second lithography step is carried out to the photoresist film 403 employing an alignment mark having been formed in the first lithography step, to thereby pattern the photoresist film 403 into a desired pattern. Then, p-type impurities are ion-implanted into the n-type well region 405B in a selected area with the patterned photoresist film 403 being used as a mask, to thereby form an impurity region 406B in the n-type well region 405B, as illustrated in FIG. 2D. The thus formed impurity region 406 will make a high-voltage p-type well for the high-voltage PMOS transistor.

Figures 2E, 2F:
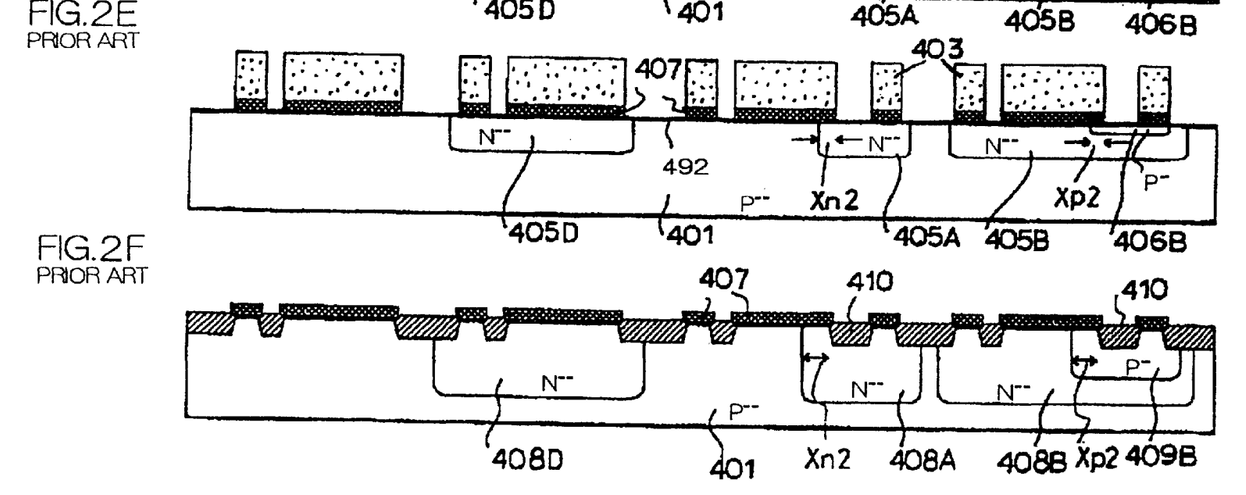

Then, as illustrated in FIG. 2E, a nitride film 407 is grown on the oxide film 492 by a thickness in the range of 150 nm to 240 nm, for instance. Then, a photoresist film 403 is deposited all over the nitride film 407, followed by a third photolithography step to thereby pattern the photoresist film 403. Then, the nitride film 407 is etched for removal in selected regions where device isolation regions are to be formed, with the patterned photo film 403 being used as a mask. After removal of all the photoresist film 403, the product is oxidized at 1000° C. to 1200° C. for about 3 hours. This oxidation doubles as a second annealing.

As a result, as illustrated in FIG. 2F, device isolation oxide films 410 are formed at a surface of the p-type silicon substrate 410. The oxide films 410 have a thickness in the range of about 50 nm to about 70 nm. By the above-mentioned oxidation, the n-type impurity regions 405A, 405B and 405D, and the p-type impurity region 406B are diffused laterally and in a depth-wise direction of the silicon substrate 401 to thereby make n-type impurity regions 408A, 408B and 408D, and the p-type impurity region 409B, respectively.

The steps mentioned so far are a known method called LOCOS for defining device formation regions. LOPOS or trench type LOCOS may be substituted for LOCOS, in which case, a distance Xn2 (see FIG. 2F) between the oxide film 410 and an outer boundary of the n-type impurity region 408A varies in dependence on a target breakdown voltage of the high-voltage NMOS transistor, and further a distance Xp2 (see FIG. 2E) between the oxide film 410 and an outer boundary of the p-type impurity region 409B varies in dependence on a target breakdown voltage of the high-voltage PMOS transistor. The distances Xn2 and Xp2 are dependent on the first and second annealing, and hence the first and second annealing are carried out in a certain range of a temperature and a period of time.

Figure 2G:
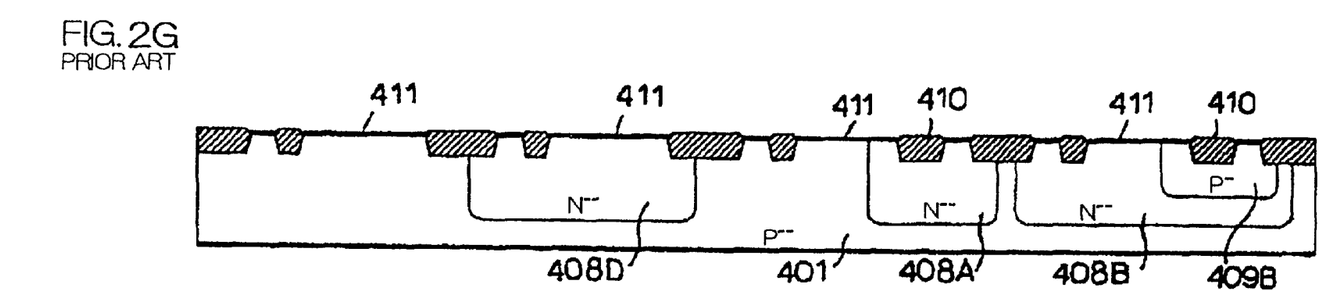

Then, as illustrated in FIG. 2G, after the nitride film 407 and the oxide film 492 have been removed, an oxide film 411 which will make a dielectric, insulating film of MOS transistors is grown at a surface of the p-type silicon substrate 401.

Then, a photoresist film 403 is deposited entirely over the product, and patterned into a desired pattern in a fourth photolithography step. Then, the dielectric, insulating film 411 is removed in a selected region where the low-voltage MOS transitors are to be formed, with the patterned photoresist film 403 being used as a mask, as illustrated in FIG. 2H.

Figures 2H, 2I:
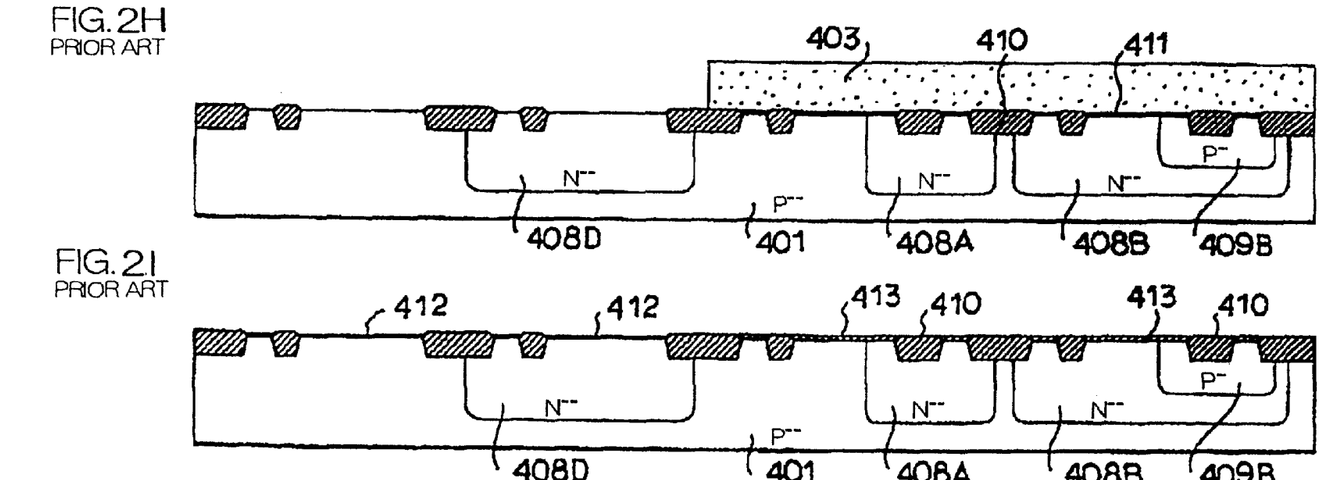

Then, after removal of the photoresist film 403, an oxide film or a dielectric, insulating film 412 for the low-voltage MOS transistors is grown at a surface of the silicon substrate, as illustrated in FIG. 2I. The oxide film or dielectric, insulating film 411 for the high-voltage MOS transistors is concurrently grown into an insulating film 413.

Figure 2J:
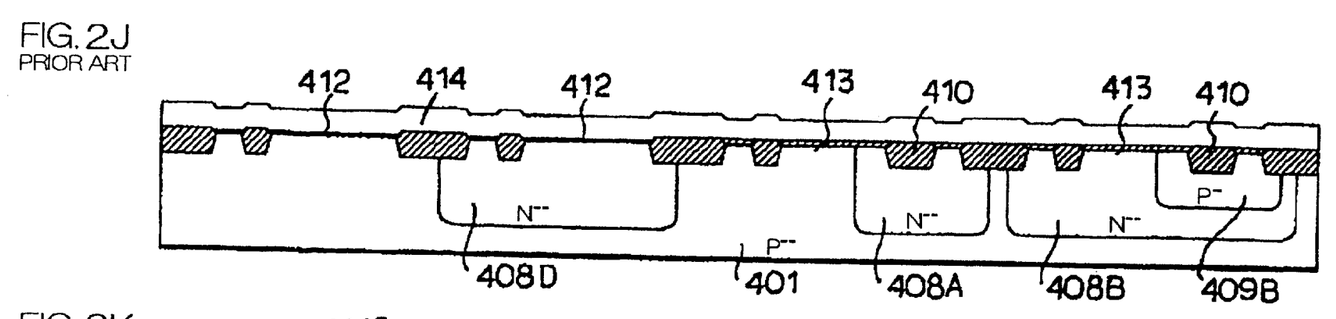

Then, as illustrated in FIG. 2J, a film 414 which will make gate electrodes of MOS transistors is grown all over the product. The film 414 is made of polysilicon or a multilayered structure of polysilicon and metal silicide.

Figures 2K, 2L:
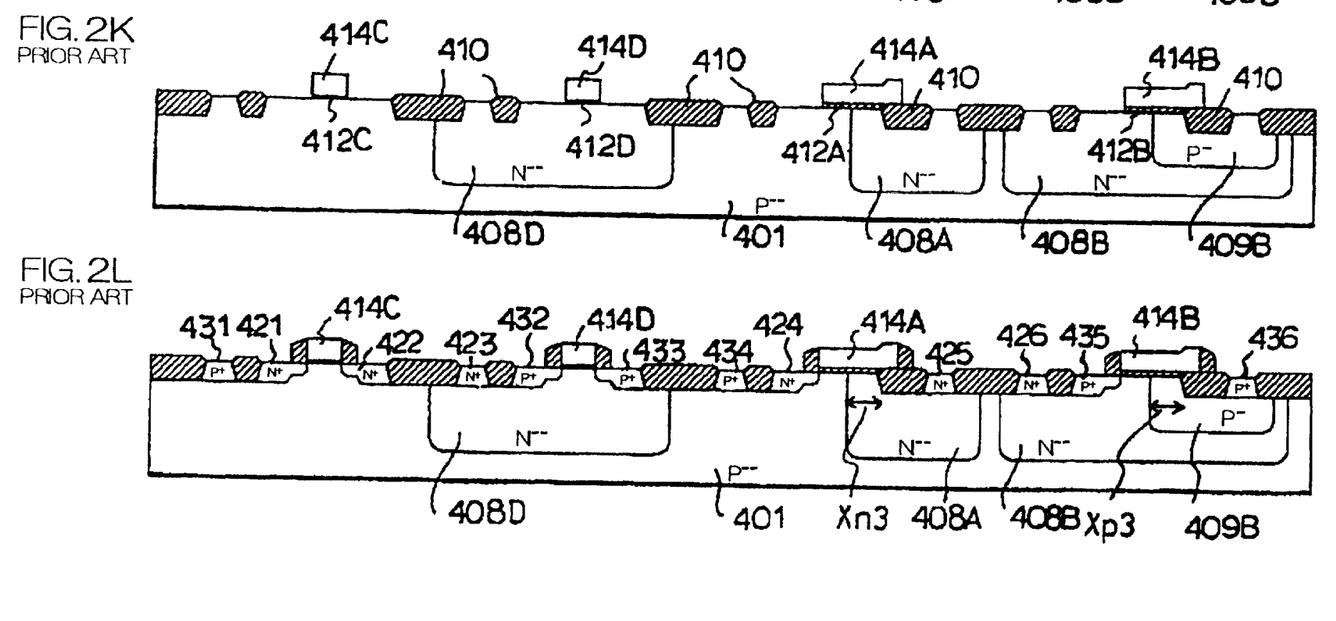

Then, a photoresist film (not illustrated) is deposited all over the polysilicon film 414, and then is patterned into a desired pattern by a fifth photolithography. Then, as illustrated in FIG. 2K, the polysilicon film 414 is etched in selected regions with the patterned photoresist film being used as an etching mask. As a result, there are formed gate electrodes 414C, 414D, 414A and 414B of the low-voltage NMOS transistor, the low-voltage PMOS transistor, the high-voltage NMOS transistor and the high-voltage PMOS transistor, respectively.

Then, as illustrated in FIG. 2L, there are formed source diffusion layers 421, 424 and drain diffusion layers 422, 425 of the low-voltage NMOS transistor and the high-voltage NMOS transistor, and channel well diffusion layers 423 and 426 of the low-voltage PMOS transistor and the high-voltage PMOS transistor. Those layers 421, 424, 422, 425, 423 and 426 are formed of highly doped n-type impurity regions. Similarly, there are formed source electrodes 432, 435 and drain electrodes 433, 436 of the low-voltage PMOS transistor and the high-voltage PMOS transistor, and channel well electrodes 431 and 434 of the low-voltage NMOS transistor and the high-voltage NMOS transistor. Those layers 432, 435, 433, 436, 431 and 434 are formed of highly doped p-type impurity regions. Thereafter, the thus formed drain, source, gate and channel well electrodes are electrically connected with each other through metal wiring layers in a conventional manner to thereby complete LSI.

In accordance with the above-mentioned conventional method, since the highly doped impurity regions constituting the drain electrodes 425 and 436 of the high-voltage MOS transistors are surrounded by the lightly doped impurity regions 408A and 409B, additional steps have to be carried out in comparison with a method of fabricating a low-voltage MOS transistor. That is, a step of annealing in the range of 1000° C. to 1200° C. has to be additionally carried out twice, and further a photolithography step for forming impurity regions in selected areas has to be additionally carried out twice. By adding those steps to steps of fabricating a low-voltage MOS transistor, the number of fabrication steps for fabricating a semiconductor device is increased, resulting in a longer period of time for fabrication of a semiconductor device.

It is known that parameters for determining a breakdown voltage, the most important characteristic of a high-voltage MOS transistor, are concentrations of impurities in both an extended drain region and a channel region, and a distance between an outer end of an extended drain region and a device isolation layer, that is, distances Xn1 and Xp1 as illustrated in FIGS. 1A and 1B.

Figure 3A:
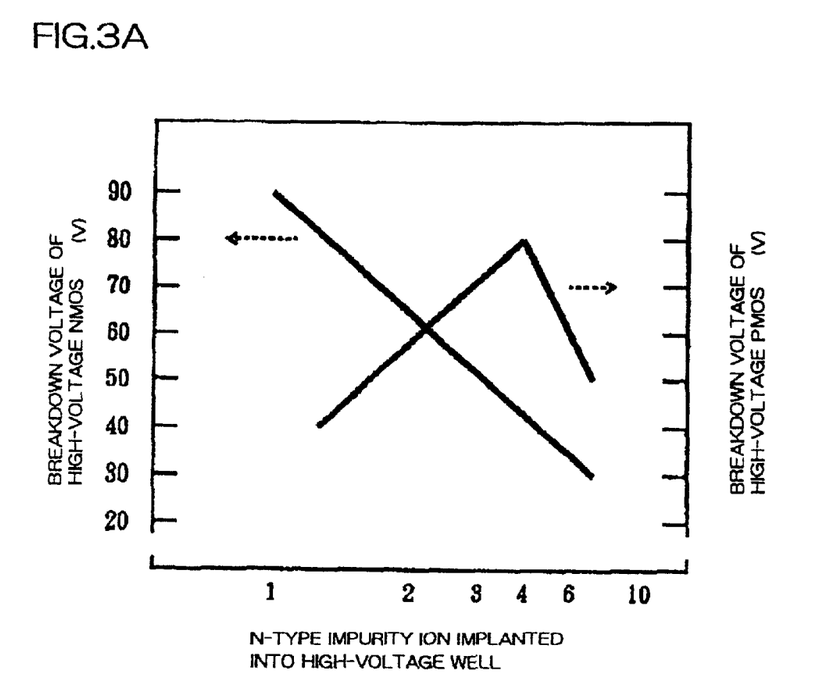
FIG. 3A illustrates a relation between an impurity concentration of a high-voltage well region and a breakdown voltage of high-voltage MOS transistors.
Figure 3B:
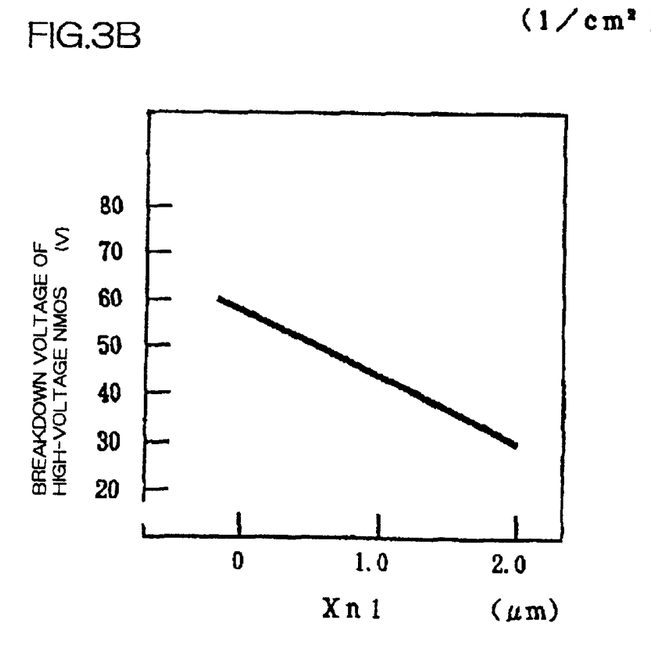
FIG. 3B illustrates a relation between (a) a distance between an extended drain region and a device isolation layer, and (b) a breakdown voltage of high-voltage MOS transistors.

FIGS. 3A and 3B show the relation between the above-mentioned parameters and a breakdown voltage. The impurity concentration is dependent on both an amount of impurities and a time of annealing at a high temperature (generally, a few hours to about 10 hours at 1000° C. to 1200° C.). In the conventional method, since high temperature thermal annealing is carried out a lot of times, it is quite difficult to control the impurity concentration with high accuracy.

The above-mentioned distances Xn1 and Xp1 correspond to distances Xn3 and Xp3 illustrated in FIG. 2L. The distance Xn3 in the high-voltage NMOS transistor is determined in a complicated manner. That is, the distance Xn3 is dependent on the lateral diffusion of the region 404A, into which n-type impurities have been implanted in FIG. 2B, caused by two high temperature thermal annealing. The distance Xp3 in the high-voltage PMOS transistor is determined in a more complicated manner. The region 406B having been formed by implanting p-type impurities thereinto with the oxide film 402 being used as an alignment mark is laterally diffused by the first high temperature annealing to thereby make the high-voltage p-type well region 409B illustrated in FIG. 2L. Apart from the high-voltage p-type well region 409B, the device isolation oxide film 410 is formed also with the oxide film 402 being used as an alignment mark. Namely, the distance Xp2 between the device isolation oxide film 410 and an outer end of the high-voltage p-type well region 409B is formed under the influence of both a dispersion caused by two photolithography steps and a dispersion caused by a high temperature thermal annealing step. Hence, there is generated a dispersion in a breakdown voltage of both the high-voltage NMOS and PMOS transistors.

When an electronic circuit is to be formed of MOS transistors, designability of a circuit may be enhanced, if a channel region of MOS transistors is electrically independent from a semiconductor substrate. For instance, in a circuit which employs NMOS transistor, and is called a negative power-supply circuit because it deals with a voltage lower than a voltage of a semiconductor substrate, a channel region of MOS transistor has to be electrically isolated from a semiconductor substrate.

However, in the above-mentioned conventional method of fabricating a semiconductor device, the channel region of the high-voltage PMOS transistor is electrically isolated from the silicon substrate, but the channel region of the high-voltage NMOS transistor is kept at the same voltage as that of the silicon substrate, which restricts the designability of a semiconductor device.

Japanese Patent Publication No. 2510751 (Japanese Unexamined Patent Publication No. 2-284462 published on Nov. 21, 1990) based on U.S. patent application Ser. No. 324,869 filed on Mar. 17, 1989 by Delco Electronics Corporation has suggested a method of fabricating -voltage and low-voltage CMOS transistors on a common integrated circuit chip. In accordance with the suggested method, an extended drain well region having a first conductivity, of a high-voltage transistor having a first conductivity is formed concurrently with well regions having a first conductivity, of high-voltage and low-voltage transistors having a second conductivity, and an extended drain well region having a second conductivity, of a high-voltage transistor having a second conductivity is formed by ion-implantation separate from the above-mentioned well region having a first conductivity.

Japanese Unexamined Patent Publication No. 7-307394 based on U.S. patent application Ser. No. 224,948 filed on Apr. 8, 1994 by Texas Instrument Incorporated has suggested an extended drain resurf lateral DMOS device. In accordance with the suggested method, there is provided a method of readily fabricating an integrated circuit including a high-voltage PMOS device and/or high-voltage NMOS device, and a low-voltage PMOS device and/or low-voltage NMOS device.

SUMMARY OF THE INVENTION

It is an object of the present invention to provide a semiconductor device in which low-voltage and high-voltage MOS transistors can be fabricated on a common semiconductor substrate in the smallest number of fabrication steps. It is also an object of the present invention to provide a method of fabricating the above-mentioned semiconductor device.

Another object of the present invention is to provide a semiconductor device in which both an electrically conductive region serving as a channel region of high-voltage NMOS transistor and an electrically conductive region serving as a channel region of high-voltage PMOS transistor are electrically independent from a semiconductor substrate. It is also another object of the present invention to provide a method of fabricating the above-mentioned semiconductor device.

A further object of the present invention is to provide a semiconductor device in which a distance between an extended drain region and a device isolation region can be controlled with high accuracy, and also provide a method of fabricating the same.

In one aspect of the present invention, there is provided a semiconductor device including (a) a semiconductor substrate having a first conductivity, (b) a first, low-voltage MOS transistor formed on the semiconductor substrate, (c) a second, high-voltage MOS transistor formed on the semiconductor substrate and having a first conductivity, (d) a third, high-voltage MOS transistor formed on the semiconductor substrate and having a second conductivity, both a first electrically conductive region containing a channel region of the third MOS transistor and a second electrically conductive region containing an extended drain region of the second MOS transistor being electrically independent of the semiconductor substrate.

It is preferable that the channel region and the extended drain region have a common conductivity, and that the channel region and the extended drain region have the same conductivity as that of the semiconductor substrate. It is preferable that the channel region and the extended drain region are both surrounded by well regions having a second conductivity. It is preferable that an insulating film formed below gate electrodes of the second and third MOS transistors at least partially has the same thickness as that of an insulating film formed below a gate electrode of the first MOS transistor.

In another aspect of the present invention, there is provided a method of fabricating a semiconductor device, including the steps, in order, of (a) forming first well regions in a semiconductor substrate in all regions in which high-voltage and low-voltage MOS transistors are to be formed, the semiconductor substrate having a first conductivity and the first well regions having a second conductivity, (b) forming an isolation layer on the semiconductor substrate for isolating the first well regions from each other, (c) forming high-voltage well regions having a first conductivity and low-voltage well regions one of which has a first conductivity and another of which has a second conductivity, and (d) forming MOS transistors on the high-voltage and low-voltage well regions.

There is further provided a method of fabricating a semiconductor device, including the steps, in order, of (a) forming an isolation layer at a surface of a semiconductor substrate for isolating device formation regions from each other, the semiconductor substrate having a first conductivity, (b) forming first well regions in the semiconductor substrate in all regions in which high-voltage and low-voltage MOS transistors are to be formed, the first well regions having a second conductivity, (c) forming high-voltage well regions having a first conductivity and low-voltage well regions one of which has a first conductivity and another of which has a second conductivity, and (d) forming MOS transistors on the high-voltage and low-voltage well regions.

It is preferable that the high-voltage and low-voltage well regions are formed with the isolation layer being used as a mark. For instance, the high-voltage well regions and the low-voltage well region having a first conductivity are first formed, and then the low-voltage well region having a second conductivity is formed in the step (c). The step (d) of forming MOS transistors on the well regions may include the steps of forming insulating films and gate electrodes for each of the MOS transistors, forming highly impurity-doped regions having a second conductivity, the highly impurity-doped regions serving as source and drain electrodes of NMOS transistors, and forming highly impurity-doped regions having a first conductivity, the highly impurity-doped regions serving as source and drain electrodes of PMOS transistors.

For instance, the high-voltage and low-voltage well regions may be formed by ion-implantation into the semiconductor substrate through an insulating layer formed on a surface of the semiconductor substrate. It is parable that annealing at 1000° C. or greater is all carried out before the high-voltage well regions are formed. Namely, it is preferable that annealing at 1000°C. or greater is not carried out after the high-voltage wells having a first conductivity have been formed.

It is preferable that the high-voltage well regions are concurrently formed, and wherein one of the high-voltage well regions serves as an extended drain region of the high-voltage MOS transistor having a first conductivity, and the other of the high-voltage well regions serves as a channel region of the high-voltage MOS transistor having a second conductivity.

In accordance with the present invention, since high-voltage and low-voltage NMOS and PMOS transistors are formed within high-voltage well regions having a conductivity opposite to a conductivity of a semiconductor substrate, all MOS transistors are electrically independent from the semiconductor substrate, ensuring designability of this kind of semiconductor device.

In the method in accordance with the present invention, after high-voltage well regions of all MOS transistors and a device isolation layer have been formed, there are formed extended drain regions, channel regions, and low-voltage well regions. Thereafter, MOS transistors are formed. Hence, it is possible to fabricate a semiconductor device only by adding the smallest number of fabrication steps to the conventional steps of fabricating low-voltage MOS transistor. This ensures simplification in fabrication steps.

In accordance with the present invention, it is possible to form a channel region and an extended drain region of high-voltage MOS transistors with a device isolation layer being used as a reference mark. In addition, since a high temperature thermal annealing is not carried out after ion-implantation of impurities into a semiconductor substrate for forming the channel region and the extended drain region, it would be possible to control, with high accuracy, a distance between the channel region or extended drain region and the device isolation region both of which are factors for determining a breakdown voltage of high-voltage MOS transistors. Furthermore, it is also possible to fabricate a semiconductor device having a desired breakdown voltage, by controlling a concentration of impurities to be implanted into a substrate for forming the channel region or extended drain region.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figures 4A, 4B, 4C:
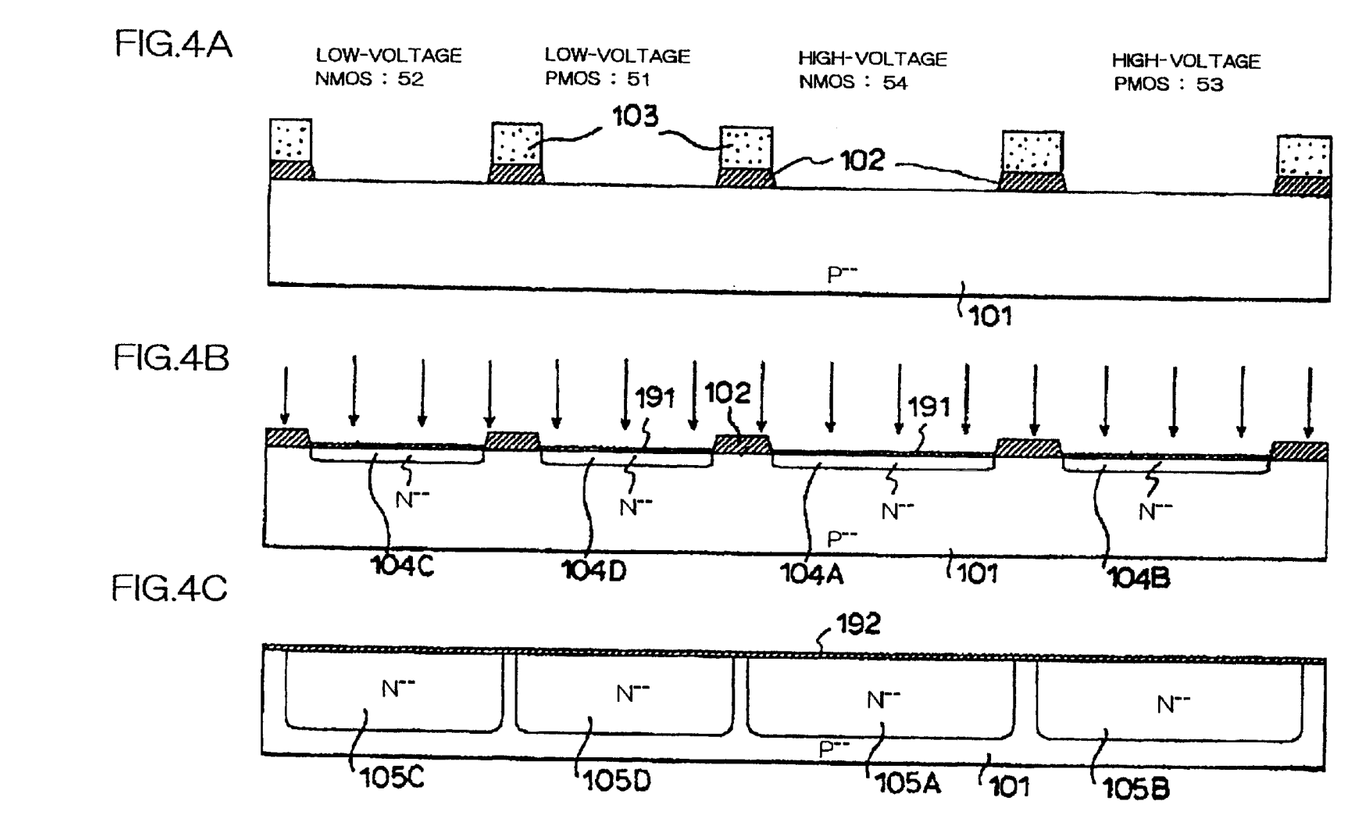
FIGS. 4A to 4K are cross-sectional views of a semiconductor device, illustrating respective steps, in order, of a method of fabricating the same in accordance with the first embodiment of the present invention.

First, there is prepared a p-type silicon substrate 101 having an impurity concentration of $0.5 \times 10^{16}$ to $1 \times 10^{16}$ $cm^{-3}$ which is a concentration of a silicon substrate to be used for a micro-computer. As illustrated in FIG. 4A, an oxide film 102 is grown at a surface of the p-type silicon substrate 101 by a thickness of 480 nm. Then, a photoresist film 103 is deposited all over the oxide film 102. The photoresist film 103 is patterned into a desired pattern in a first photolithography step. Then, the oxide film 102 is etched with the thus patterned photoresist film 103 being used as an etching mask, to thereby remove the oxide film 102 in selected regions where high-voltage n-type well regions are to be formed. Thus, there are formed openings in the oxide film 102 so that n-type impurities may be ion-implanted into all or necessary regions in a low-voltage NMOS transistor 52, a low-voltage PMOS transistor 51, a high-voltage NMOS transistor 52, and a high-voltage PMOS transistor 53. In the instant embodiment, openings are formed in the oxide film 102 in all regions where the transistors 51 to 54 are to be formed. However, for instance, an opening may not be formed in a region where the low-voltage PMOS transistor 51 is to be formed.

Then, as illustrated in FIG. 4B, after removal of the photoresist film 103, a thin oxide film 191 is grown at the exposed regions of the silicon substrate 101 for preventing channeling of ion-implantation and precipitation of impurities caused by high temperature thermal annealing. The oxide film has a thickness of about 40 nm. Then, the p-type silicon substrate 101 is implanted at 150 KeV with doses of $1 \times 10^{13}$ $cm^{-2}$ of n-type impurity ions such as phosphorus with the oxide film 102 being used as an ion-implantation mask. Thus, there are formed impurity regions 104C, 104D, 104A and 104B at a surface of the silicon substrate 101.

Then, a first annealing is carried out at 1200° C. for about 8 hours. As a result, the n-type impurity regions 104C, 104D, 104A and 104B are diffused laterally and in a depth-wise direction of the p-type silicon subtrate 101 to thereby make diffusion regions 105C, 105D, 105A and 105B, as illustrated in FIG. 4C. The oxide films 102 and 191 are all removed, and then a thin oxide film 192 is formed again at a surface of the p-type silicon substrate 101.

Figure 4D:
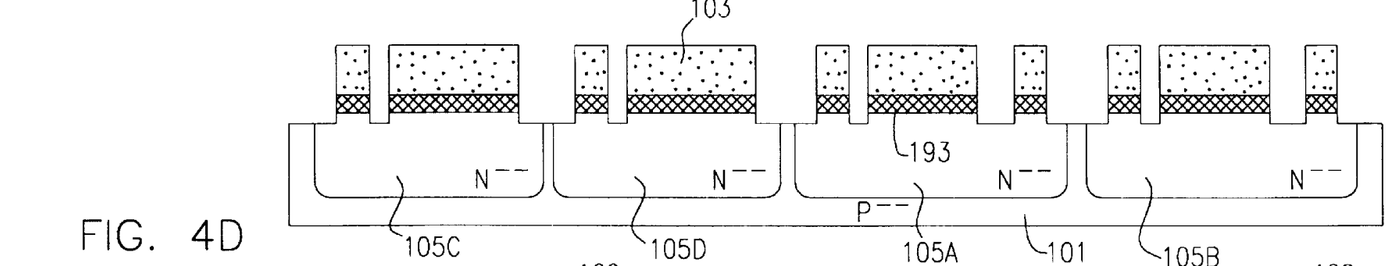

Then, as illustrated in FIG. 4D, there is formed a nitride film 193 on the oxide film 192 by a thickness in the range of 150 to 240 nm, for instance. Then, a photoresist film 103 is deposited all over the nitride film 193, followed by a second photolithography step to thereby pattern the photoresist film 103 into a desired pattern. Then, the oxide film 192 and the nitride film 193 are etched for removal in selected regions where device isolation regions are to be formed, with the patterned photoresist film 103 being used as an etching mask. The silicon substrate 101 is further etched in the regions at a depth in the range of 50 to 80 nm, as illustrated in FIG. 4D.

Figure 4E:
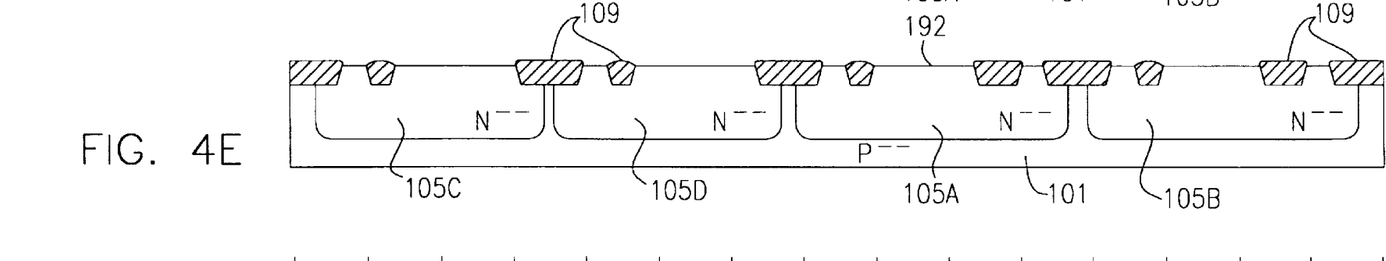

As illustrated in FIG. 4E, after removal of all the photoresist film 103, the product is oxidized at 950° C. to 1050° C. for about 2 hours. The oxidation is arranged so that an oxide film or device isolation film 109 to be formed at a surface of the silicon substrate 101 has a thickness in the range of about 50 to about 60 nm. This oxidation step is also carried out when only a low-voltage MOS transistor is fabricated, and hence is not an extra step. Though the high-voltage n-type well regions 105C, 105D, 105A and 105B are slightly diffused in the oxidation step, the lateral diffusion length of the high-voltage n-type well regions 105C, 105D, 105A and 105B does not exert an influence on a breakdown voltage of the high-voltage NMOS transistor, as mentioned later. Thereafter, the nitride film 193 is all removed. Thus, the device isolation step is completed.

The steps mentioned so far are a known method called trench-type LOCOS for defining device formation regions. LOPOS or LOCOS may be substituted for trench-type LOCOS. As an alternative, trench device isolation may be employed.

Figure 4F:
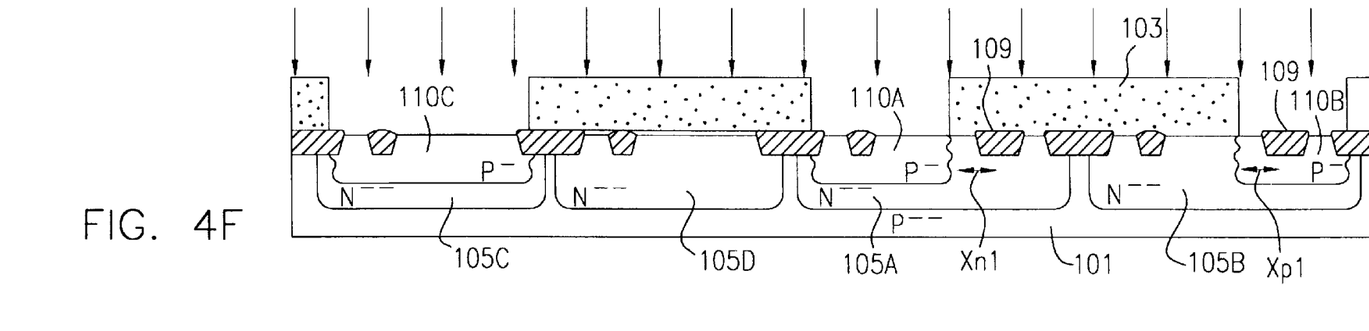

Then, a photoresist film 103 is deposited all over the product, and is patterned into a desired pattern by a third photolithography step with the device isolation film 109, which has been formed in the second lithography step, being used as an alignment mark. Then, p-type impurities are ion-implanted into the selected regions through the oxide film 192. Thus, there are formed impurity regions 110C, 110A and 110B in the high-voltage n-type well regions 105C, 105A and 105B, respectively. The impurity region 110A will make a channel well of the high-voltage NMOS transistor 54, the impurity region 110B will make an extended drain electrode of the high-voltage PMOS transistor 53, and the impurity region 110C will make a channel well of the low-voltage NMOS transistor 52. Since the locations of the impurity regions 110A and 110B are determined in the lithography step carried out with the device isolation film 109 being used as a reference mark, and are not diffused in the subsequent thermal annealing, the distances Xn1 and Xp1, which are important factors for a high-voltage MOS transistor, would have a small dispersion.

Figure 4G:
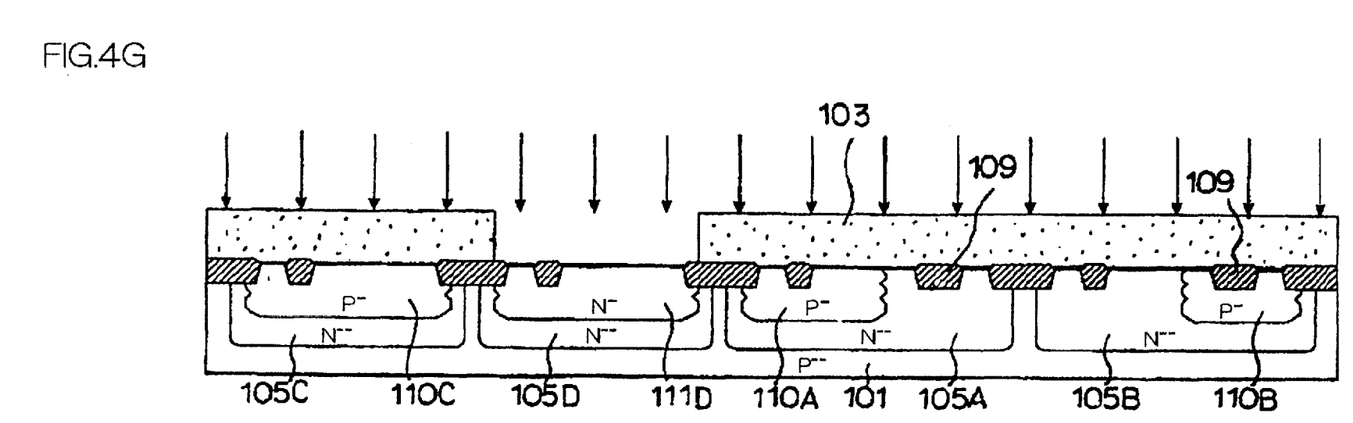

Then, a photoresist film 103 is deposited all over the product, and is patterned into a desired pattern in a fourth photolithography step, as illustrated in FIG. 4G. Then, n-type impurities are ion-implanted in a selected region in the high-voltage n-type well region 105D through the oxide film 192 with the patterned photoresist film 103 being used as a mask, to thereby form an impurity region 111D in the high-voltage n-type well region 105D. The thus formed impurity region 111D will make a channel well of the low-voltage PMOS transistor 51. This step of forming the impurity region 111D by ion-implantation is also carried out when only a low-voltage MOS transistor is to be formed, and hence is not an extra step.

Figure 4H:
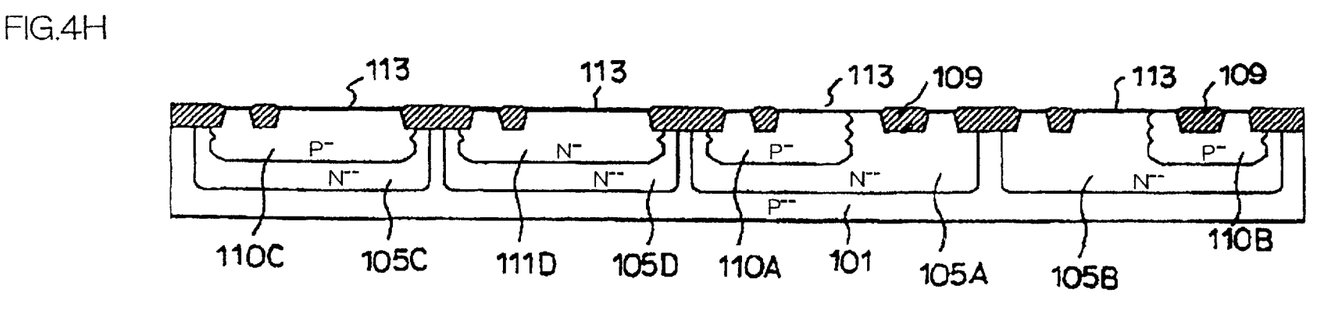

Thereafter, an oxide film 113 serving as a dielectric, insulating film of the MOS transistors is formed at a surface of the silicon substrate 101, as illustrated in FIG. 4H.

Figure 4I:
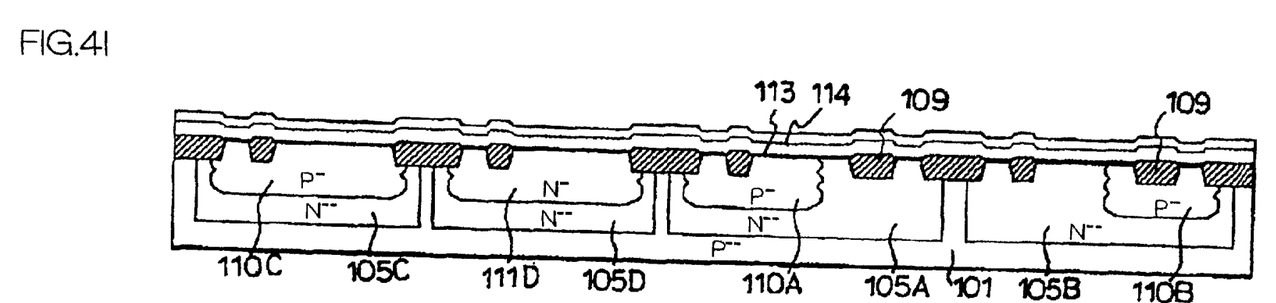

Then, as illustrated in FIG. 4I, a film 114 which will make gate electrodes of the MOS transistors is grown all over the product. The film 114 is made of a multi-layered sire of polysilicon and metal suicide. As an alternative, the film 114 may be made of only polysilicon.

Figure 4J:
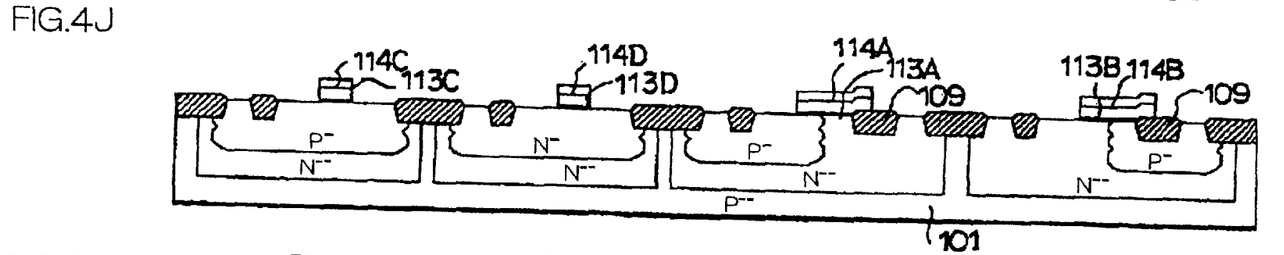

Then, a photoresist film (not illustrated) is deposited all over the multi-layered film 114, and then is patterned into a desired pattern by a fifth photolithography. Then, as illustrated in FIG. 4J, the multi-layered film 114 is etched in selected regions with the patterned photoresist film being used as an etching mask. As a result, there are formed gate electrodes 114C, 114D, 114A and 114B of the low-voltage NMOS transistor 52, the low-voltage PMOS transistor 51, the high-voltage NMOS transistor 54, and the high-voltage PMOS transistor 53, respectively.

Figure 4K:
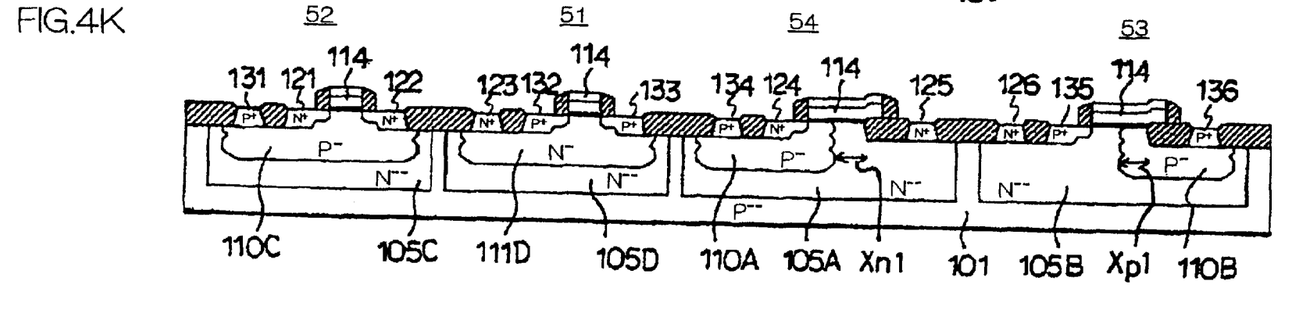

Then, as illustrated in FIG. 4K, there are formed source electrodes 121, 124 and drain electrodes 122, 125 of the low-voltage NMOS transistor 52 and the high-voltage NMOS transistor 54, and channel well electrodes 123 and 126 of the low-voltage PMOS transistor 51 and the high-voltage PMOS transistor 53. Those electrodes 121, 124, 122, 125, 123 and 126 are formed of highly doped n-type impurity regions. Similarly, there are formed source electrodes 132, 135 and drain electrodes 133, 136 of the low-voltage PMOS transistor 51 and the high-voltage PMOS transistor 53, and channel well electrodes 131 and 134 of the low-voltage NMOS transistor 52 and the high-voltage NMOS transistor 54. Those layers 132, 135, 133, 136, 131 and 134 are formed of highly doped p-type impurity regions. Thereafter, the thus formed drain, source, gate and channel well electrodes are electrically connected with each other through metal wiring layers (not illustrated) in a conventional manner to thereby complete LSI.

In accordance with the above-mentioned first embodiment, it is possible to form low-voltage and high-voltage NMOS and PMOS transistors in a common semiconductor substrate by adding the smallest number of fabrication steps to a conventional method. In addition, since high-voltage and low-voltage NMOS and PMOS transistors are formed within high-voltage well regions having a conductivity opposite to a conductivity of a semiconductor substrate, all MOS transistors are electrically independent from the semiconductor substrate, ensuring designability of a circuit.

In the method in accordance with the first embodiment, after the step illustrated in FIG. 4E has been completed, there does not exist a step of high temperature annealing at 1000° C. or greater. Furthermore, as illustrated in FIG. 4F, after the device isolation film 109 has been formed, there are formed the impurity region 110A which will make a channel well of the high-voltage NMOS transistor 54, the impurity region 110B which will make an extended drain electrode of the high-voltage PMOS transistor 53, and the impurity region 110C which will make a channel well of the low-voltage NMOS transistor 52. Those impurity regions 110A, 110B and 110C are formed by ion-implantation with the device isolation film 109 being used as an alignment mark. Accordingly, it is now possible to place the distances Xn1 and Xp1, which are important factors for determining a breakdown voltage of the high-voltage MOS transistor, within a dispersion caused by a single photolithography step. Namely, the distances Xn1 and Xp1 can be controlled with high accuracy.

In addition, as illustrated in FIG. 3A, it would be possible to have a desired breakdown voltage in the range of 20V to 80V merely by adjusting an amount of n-type impurities to be implanted into the silicon substrate in the step of forming the high-voltage n-type well regions.

Second Embodiment

A method in accordance with the second embodiment is explained hereinbelow with reference to FIGS. 5A to 5D. The second embodiment is characterized by that a device isolation step is carried out at first.

Figure 5A:
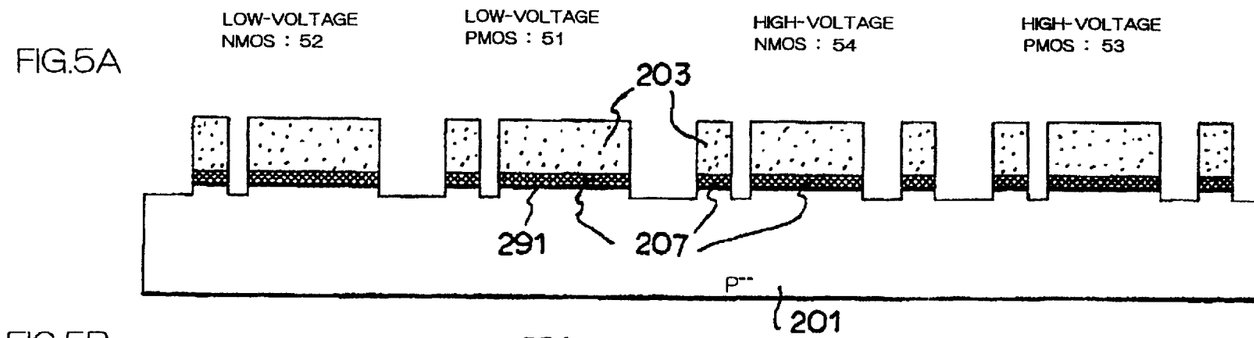
FIGS. 5A to 5D are cross-sectional views of a semiconductor device, illustrating respective steps, in order, of a method of fabricating the same in accordance with the second embodiment of the present invention.

As illustrated in FIG. 5A, a thin oxide film 291 is formed on a surface of a semiconductor substrate 201, and then a nitride film 207 is grown all over the oxide film 291 by a thickness in the range of 150 nm to 240 nm, for instance. Then, a photoresist film 203 is deposited all over the nitride film 207, followed by a first photolithography step to thereby pattern the photoresist film 203 into a desired pattern. Then, the oxide film 291 and the nitride film 207 are etched for removal in selected regions where device isolation regions are to be formed, with the patterned photoresist film 203 being used as an etching mask. The silicon substrate 201 is further etched in the regions at a depth in the range of 50 nm to 80 nm, as illustrated in FIG. 5A.

Figure 5B:
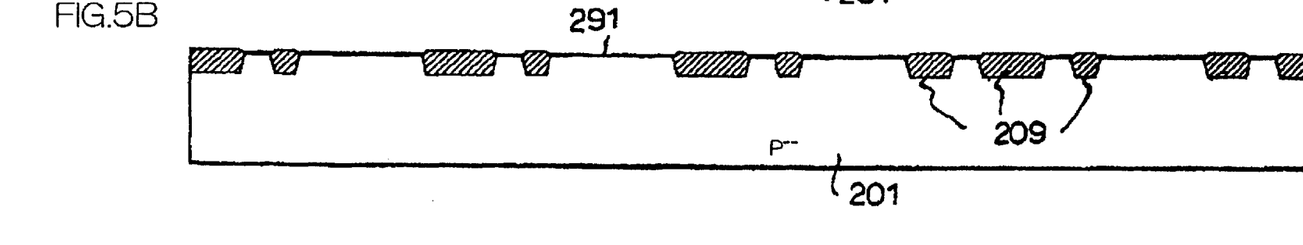

As illustrated in FIG. 5B, after removal of all the photoresist film 203, the product is oxidized at 950° to 1050° C. for about 2 hours. The oxidation is arranged so that an oxide film or device isolation film 209 to be formed at a surface of the silicon substrate 201 has a thickness in the range of about 50 nm to about 60 nm. This oxidation step is also carried out when only a low-voltage MOS transistor is fabricated, and hence is not an extra step. Thereafter, the nitride film 207 is all removed. Thus, the device isolation step is completed. Though the second embodiment employs the technique called trench-type LOCOS for forming device isolation films, similarly to the first embodiment, there may be employed trench device isolation including the steps of etching a semiconductor substrate in device isolation regions by a depth in the range of 30 nm to 40 nm, filling the etched regions with an oxide film by low-temperature oxide film growth, and polishing the oxide film to thereby form the device isolation film 209.

After the formation of the device isolation film 209, there is grown a thin oxide film 291 at a surface of the semiconductor substrate 201, as illustrated in FIG. 5B.

Figure 5C:
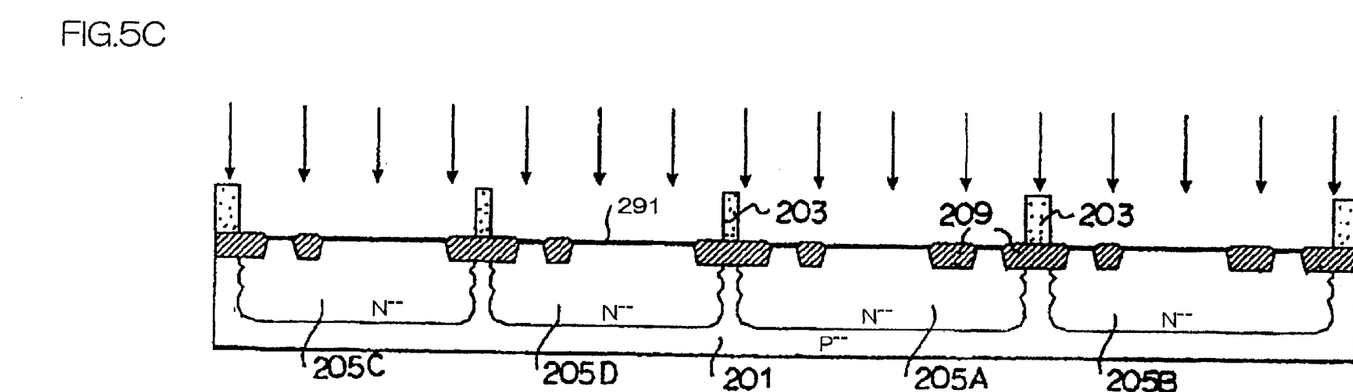

Then, a photoresist film 203 is deposited all over the product, and is patterned into a desired pattern by a second photolithography step. Then, n-type impurities are ion-implanted into the selected regions through the oxide film 291. Thus, there are formed impurity regions 205C, 205D, 205A and 205B in the semiconductor substrate 201, as illustrated in FIG. 5C.

Figure 5D:
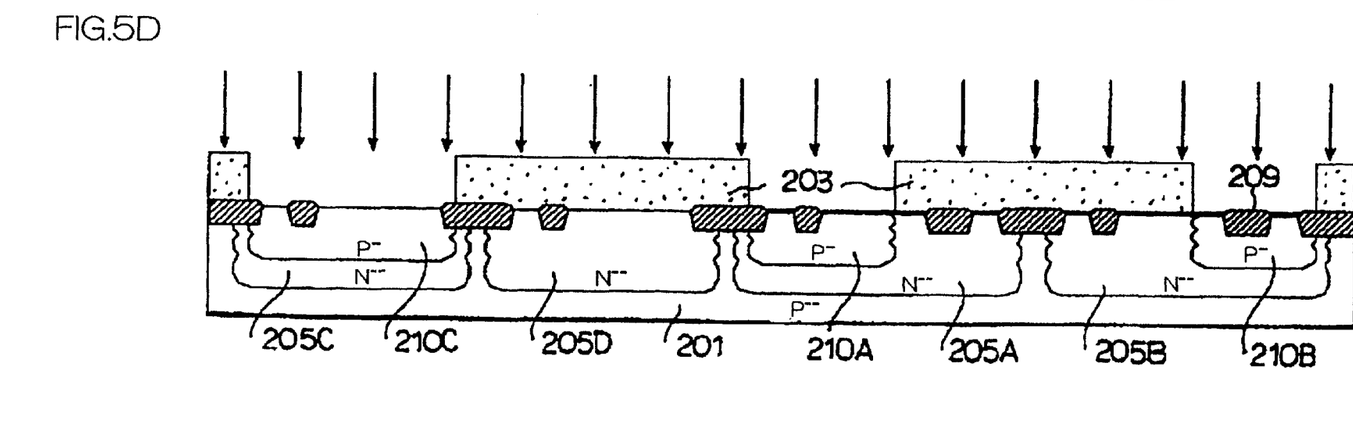

Then, a photoresist film 203 is deposited all over the product, and is patterned into a desired pattern by a third photolithography step with the device inflation film 209, which has been formed in the send lithography step, being used as an alignment mark. Then, p-type impure are ionimplanted into the selected regions through the oxide film 291. Thus, there are aimed impurity regions 210C, 210A and 210B in the high-voltage n-type well regions 205C, 205A and 205B, respectively.

Hereinbelow, the same steps as those illustrated in FIGS. 4G to 4K are carried out.

The above-mentioned second embodiment provides the same advantages as those obtained by the first embodiment. In accordance with the second embodiment, since it is possible to omit the first annealing for the high-voltage n-type well regions, the fabrication steps are simplified, and the distances Xn1 and Xp1 are made with higher accuracy.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-340694 filed on Dec. 20, 1996 including specification, claims, drawings and summary is incorporated herein by reference in its entirety.

What is claimed is:

1. A method of fabricating a semiconductor device, comprising the steps, in order, of:
   (a) forming first well regions in a semiconductor substrate in all regions in which high-voltage and low-voltage MOS transistors are to be formed, said semiconductor substrate having a first conductivity and said first well regions having a second conductivity;
   (b) forming an isolation layer on said semiconductor substrate for isolating said first well regions from each other;
   (c) forming high-voltage well regions having a first conductivity and low-voltage well regions one of which has a first conductivity and another of which has a second conductivity; and
   (d) forming MOS transistors on said high-voltage and low-voltage well regions,
   wherein said high-voltage well regions are concurrently formed, and
   wherein one of said high-voltage well regions serves as an extended drain region of said high-voltage MOS transistor having a first conductivity, and the other of said high-voltage well regions serves as a channel region of said high-voltage MOS transistor having a second conductivity.

2. The method as set forth in claim 1, wherein said high-voltage and low-voltage well regions are formed with said isolation layer being used as a mask.

3. The method as set forth in claim 1, wherein said high-voltage well regions and said low-voltage well region having a first conductivity are first formed, and then said low-voltage well region having a second conductivity is formed in said step (c).

4. The method as set forth in claim 1, wherein said step (d) comprises the steps of:
   (d-1) forming insulating films and gate electrodes for each of said MOS transistors;
   (d-2) forming highly impurity-doped regions having a second conductivity, said highly impurity-doped regions serving as source and drain electrodes of NMOS transistors; and
   (d-3) forming highly impurity-doped regions having a first conductivity, said highly impurity-doped regions serving as source and drain electrodes of PMOS transistors.

5. The method as set forth in claim 1, wherein maid high-voltage and low-voltage well regions are formed by ion-implantation into said semiconductor substrate through an insulating layer formed on a surface of said semiconductor substrate.

6. The method as set forth in claim 1, wherein annealing at 1000° C. or greater is all carried out before said high-voltage well regions are formed.

7. A method of fabricating a semiconductor device, comprising the steps, in order, of:
   (a) forming an isolation layer at a surface of a semiconductor substrate for isolating device formation regions from each other, said semiconductor substrate having a first conductivity;
   (b) forming first well regions in said semiconductor substrate in all regions in which high-voltage and low-voltage MOS transistors are to be formed, said first well regions having a second conductivity;
   (c) forming high-voltage well regions having a first conductivity and low-voltage well regions one of which has a first conductivity and another of which has a second conductivity; and
   (d) forming MOS transistors on said high-voltage and low-voltage well regions, wherein said high-voltage well regions are concurrently formed, and wherein one of said high-voltage well regions serves as an extended drain region of said high-voltage MOS transistor having a first conductivity, and the other of said high-voltage well regions serves as a channel region of said high-voltage MOS transistor having a second conductivity.

8. The method as set forth in claim 7, wherein said high-voltage and low-voltage well regions are formed with said isolation layer being used as a mask.

9. The method as set forth in claim 7, wherein said high-voltage well regions and said low-voltage well region having a first conductivity are first formed, and then said low-voltage well region having a second conductivity is formed in said step (c).

10. The method as set forth in claim 7, wherein said step (d) comprises the steps of:

(d-1) forming insulating films and gate electrodes for each of said MOS transistors;

(d-2) forming highly impurity-doped regions having a second conductivity, said highly impurity-doped regions serving as source and drain electrodes of NMOS transistors; and (d-3) forming highly impurity-doped regions having a first conductivity, said highly impurity-doped regions serving as source and drain electrodes of PMOS transistors.

11. The method as set forth in claim 7, wherein said high-voltage and low-voltage well regions are formed by ion-implantation into said semiconductor substrate through an insulating layer formed on a surface of said semiconductor substrate.

12. The method as set forth in claim 7, wherein annealing at 1000° C. or greater is all carried out before said high-voltage well regions are formed.

* * * * *